United States Patent [19]

Lee et al.

[11] Patent Number: 5,314,833

[45] Date of Patent: May 24, 1994

[54] METHOD OF MANUFACTURING GAAS METAL SEMICONDUCTOR FIELD EFFECT TRANSISTOR

[75] Inventors: Kyung-Ho Lee; Kyoung-Ik Cho; Yong-Tak Lee, all of Daejeon-shi, Rep. of Korea

[73] Assignee: Electronics & Telecommunications Research Institute, Daejeon-shi, Rep. of Korea

[21] Appl. No.: 996,052

[22] Filed: Dec. 23, 1992

[30] Foreign Application Priority Data

Dec. 26, 1991 [KR] Rep. of Korea .................... 91-24510

[51] Int. Cl.$^5$ .................................... H01L 21/265
[52] U.S. Cl. .................................... 437/41; 437/22; 437/161; 437/184; 437/912
[58] Field of Search ............... 437/41, 203, 912, 234, 437/184; 148/DIG. 53, DIG. 56

[56] References Cited

U.S. PATENT DOCUMENTS

| | | | |
|---|---|---|---|
| 4,298,403 | 11/1981 | Davey et al. | 437/184 |
| 4,656,076 | 4/1987 | Vetanen et al. | 437/41 |
| 4,728,621 | 3/1988 | Graf et al. | 437/41 |
| 4,732,871 | 3/1988 | Buchmann et al. | 437/41 |
| 4,849,368 | 7/1989 | Yamashita et al. | 437/234 |
| 4,929,567 | 5/1990 | Park et al. | 437/41 |
| 5,073,512 | 12/1991 | Yoshino | 437/41 |

FOREIGN PATENT DOCUMENTS 63173318 7/1988 Japan .................... 437/912

*Primary Examiner*—Brian E. Hearn
*Assistant Examiner*—Michael Trinh
*Attorney, Agent, or Firm*—Antonelli, Terry, Stout & Kraus

[57] ABSTRACT

A method of manufacturing a GaAs field effect transistor comprises depositing a silicon thin film 202 on a semi-insulating semiconductor substrate 201, forming a first sensitive film 203 by a photolithography to define channel areas and ion-implanting n-type dopants into the substrate to form an activation layer, removing the first sensitive film, forming a second sensitive film 203a on the silicon thin film by photolithography to define an ohmic contact area and then forming a highly doped impurity layer on the side of the activation layer by way of an ion-implantation process, depositing a passivation film 206 over the entire surface of the substrate 201 after the removal of the sensitive film, and effecting an annealing or heat treatment, forming a third sensitive film of a predetermined pattern by using an ohmic contact forming mask, effecting a recess etching process to the surface of the substrate and forming an ohmic contact on the etched portion, and patterning a gate region by using the gate forming mask, recess-etching the surface of the substrate and depositing a low resistivity metal to form a gate.

6 Claims, 3 Drawing Sheets

METHOD OF MANUFACTURING GAAS METAL SEMICONDUCTOR FIELD EFFECT TRANSISTOR

BACKGROUND OF THE INVENTION

1. Field of the Invention

The present invention relates to a method of manufacturing a GaAs metal semiconductor field effect transistor (GaAs MESFET), which method implants ions and diffuses silicon from a silicon thin film deposited on a surface of a GaAs compound semiconductor to dope silicon in an ohmic contact portion at a high concentration and which etches the contact portion by way of recess etching, thereby improving an electrical property of the transistor.

2. Description of related Art

Referring to FIGS. 1 (A) through (F), a process of manufacturing such a GaAs field effect transistor employing a self-aligned gate structure made of a thermostable metal (heatproof metal) is illustrated. As shown in FIG. 1 (A), a sensitive film 102 having a predetermined pattern is deposited over a GaAs substrate 101 and an impurity ion is implanted into the substrate 101 to form a n-channel impurity implanted layer 101a in the substrate 101. After the sensitive film 102 is removed, a tungsten silicide thin film 103 which is a thermostable metal thin film is formed on the substrate 101 by way of a sputtering method, as shown in FIG. 1 (B). Consequently, as shown in FIG. 1 (C), a sensitive film 102a of a predetermined pattern is formed on the film 103 and this film 103 is etched by a dry ion etching method using the sensitive film 102a as a mask to form a gate electrode 103a as shown in FIG. 1 (D).

Next, as shown in FIG. 1 (E), a sensitive film 102b is formed on the substrate 101 except on the impurity implanted layer 101a and an impurity of a high concentration is implanted to provide a highly concentrated n-type impurity layer 101b below the n-type impurity implanted layer 101a between the sensitive film 102b and the gate electrode 103a. Subsequently, as shown in FIG. 1 (F), the sensitive film 102b is removed and an ohmic contact 104 is then formed on the n-type impurity implanted layer 101a to complete a desired transistor.

By the way, the gate electrode 103a thus formed is substantially formed with a thermostable gate made of a tungsten compound such as tungsten silicide to prevent it from reacting with the GaAs substrate in a heat treatment such as an annealing. The ohmic contact 104 is typically formed by ion-implanting an impurity such as silicon at a high concentration with use of the gate electrode as a mask and activating the impurity by way of a subsequent heat treatment.

With such a conventional method, a thermostable alloy such as a tungsten silicide is employed as a gate electrode material because it prevents the substrate from the high temperature during the heat treatment and is unchanged in property. The gate, however, has a relatively large resistivity, thereby resulting in the problem that the transistor is reduced in operating speed. With such a conventional method, also, it is difficult to employ it to fabricate a high speed transistor or microwave transistor.

To reduce such a resistivity of the gate, a two-layered gate is employed. In the structure, when the gate is etched by dry etching, it is difficult to know an etching stop timing because the gate has a etching selection ratio different from the gate material.

Further, the substrate is roughened by the high concentrated impurity ion implantation executed to form the ohmic contact. For this reason, if electrical activation of the impurity is insufficient, then the resistance of the contact portion is increased, decreasing the electrical property of a channel area.

SUMMARY OF THE INVENTION

Accordingly, an object of the present invention is to a method of manufacturing a metal semiconductor field effect transistor (MESFET), which reduces the contact resistance of an ohmic contact, etches a surface of an electrode contacting portion by a predetermined depth by way of recess etching, removes a surface state area disturbing the operation of elements, and employs a gate material having a relatively lower resistivity irrespective of its thermostability, thereby improving an operational property of the transistor.

To achieve the above object, according to the this invention, a silicon thin film is deposited on a surface of a GaAs substrate. After a silicon ion implantation effected through a channel pattern and an arsenic (As) or phosphorus (P) ion implantation effected through an ohmic contact (electrode) pattern, silicon is diffused from the silicon thin film into the substrate by way of a heat treatment and activation of the implantation is the carried out for a highly doped ohmic contact and a lightly doped channel.

At this time, to remove a surface state area formed on the surface of the substrate during the silicon thin film diffusion, the ion implantation and the diffusion, which deteriorates an electrical property of an element, an electrode contact portion is recess-etched by a predetermined thickness and a gate is then formed from a material having a lower electrical resistivity.

The above and other objects and advantages of the invention will be apparent from the following specification taken in conjunction with the accompanying drawings.

DETAILED DESCRIPTION OF THE INVENTION

Figure 1A:
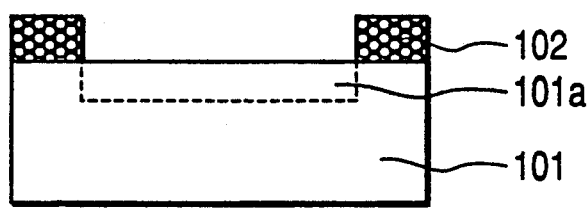
FIGS. 1 (A) to (F) are sectional views illustrating a process of manufacturing a conventional GaAs MESFET using a thermostable gate; and, FIGS. 2 (A) to (G) are sectional views illustrating a process of manufacturing a GaAs MESFET using an ohmic contact forming method according to the invention.
Figure 1B:
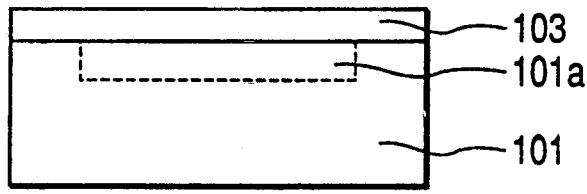
Figure 1C:
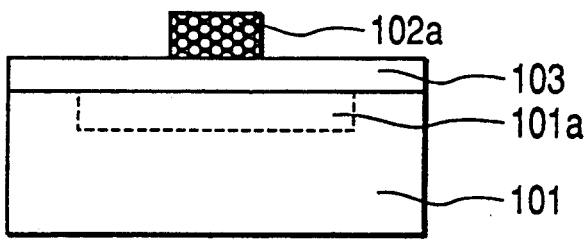
Figure 1D:
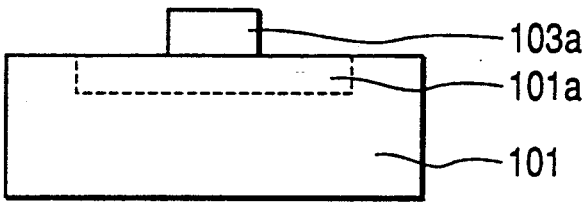
Figure 1E:
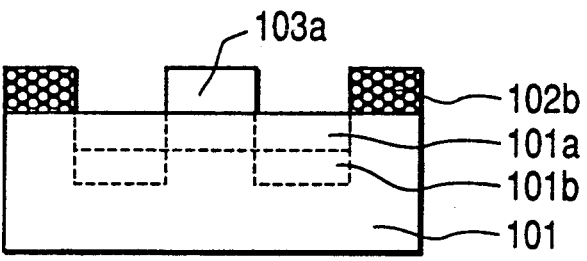
Figure 1F:
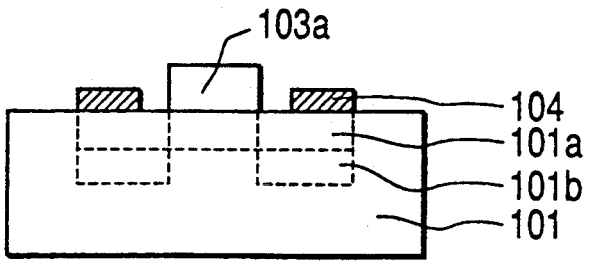
Figure 2A:
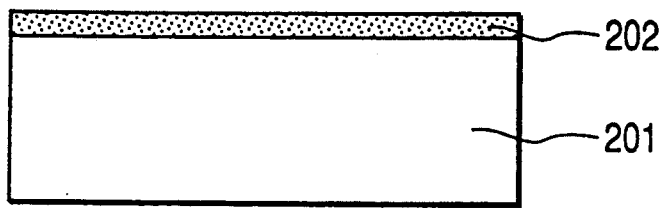
Figure 2B:
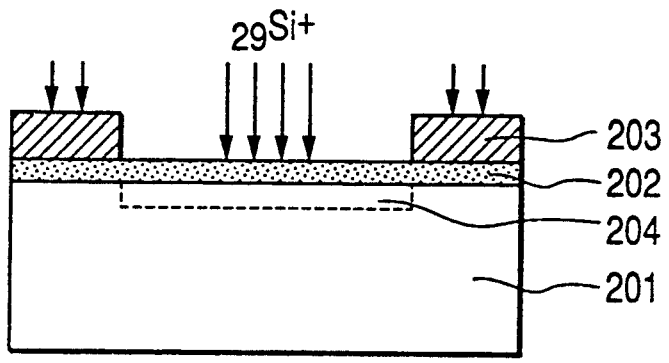
Figure 2C:
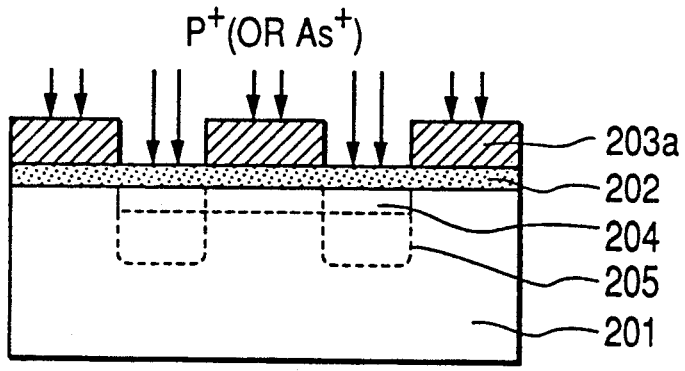
Figure 2D:
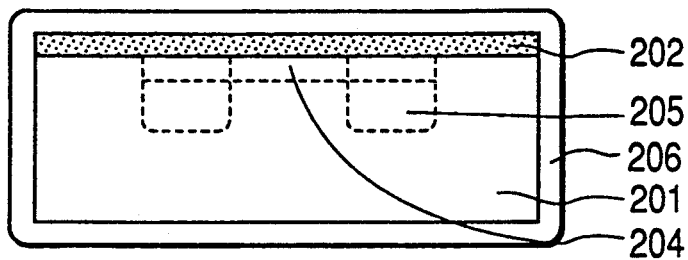
Figure 2E:
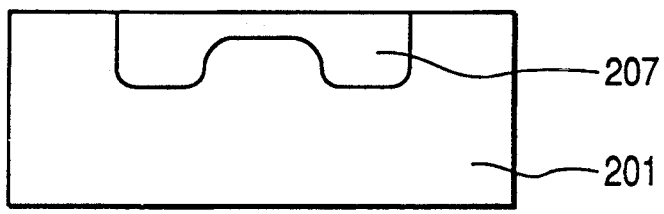
Figure 2F:
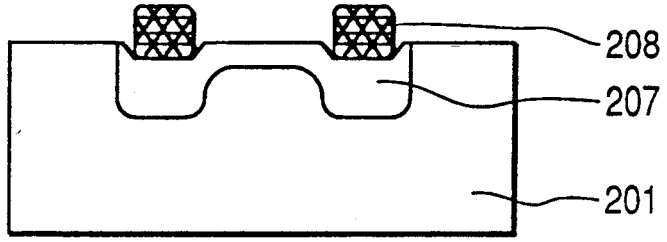
Figure 2G:
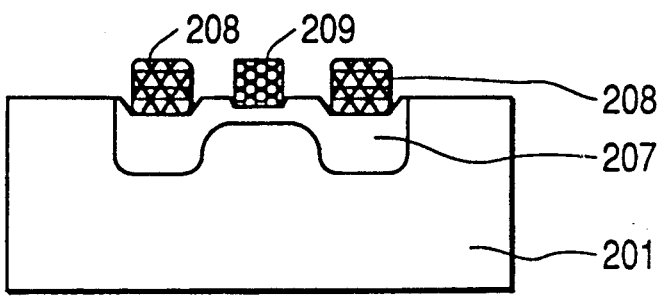

Hereinafter, the invention will be described in more detail. As shown in FIG. 2 (A), a silicon thin film 202 of about 100 Å is deposited over a surface of a semi-insulating GaAs substrate 201 by way of an electron beam evaporation or sputtering deposition after a surface washing and etching process. A sensitive film 203 of a predetermined pattern is formed on the silicon thin film 202 by a photolithography to define a channel area. Consequently, silicon ions(Si$^+$) are implanted to form an activation layer 204 in the substrate 201, as shown in FIG. 2 (B). In the ion implantation, the silicon employed as the impurity may be substituted by another n-type dopant such as selenium (Se), sulfur (S) or the like.

Subsequentially, as shown in FIG. 2 (C) the sensitive film 203 is removed and a sensitive film 203a of a predetermined pattern is then deposited to define an ohmic contact area. Subsequently, an impurity such as phosphorus or arsenic is implanted into the area to form a highly doped impurity layer 205. At this time, the amount and energy of the ion implantation is controlled such that an interface defined between the substrate 201 and the silicon thin film 202 is effectively broken and, during a subsequent heat treatment, silicon is easily diffused into the substrate by way of a mutual diffusion.

Next, in order to effect a heat treatment to electrically activate the silicon ion implanted into the substrate 201 and to diffuse the silicon contained in the silicon thin film 202 into the substrate 201, the sensitive film 203a is removed as shown in FIG. 2 (D). Subsequently, a passivation film 206 is deposited over the substrate surface to prevent evaporation of ions from the substrate surface. The passivation film 206 is formed from a silicon oxide film, a silicon nitride film, a silicon oxynitride film or an aluminum nitride film. The passivation film 206 may be formed by way of a CVD (chemical vapor deposition) method, a sputtering method, a plasma chemical vapor deposition, an electron beam deposition method or the like. The heat treatment process such a an annealing is effected by an environment furnace at a temperature of 800° C. for several seconds or several tens of minutes in a case of a rapid thermal annealing or an ordinary furnace annealing.

In fact, though the silicon thin film 202 deposited on the GaAs substrate 201 is thermally stable, the interface between the silicon thin film 202 and the substrate 201 is damaged in stability due to external defect reasons, thereby causing the mutual diffusion. The external defect reasons include damage caused to the interface during the ion implantation.

The ion implantation of silicon into the channel area is effected with an energy and amount lower then the ion implantation condition to the ohmic contact portion. Accordingly, the damage caused by the ion implantation into the channel area as well as the silicon diffusion from the silicon thin film 202 are less than in the ohmic contact portion. The silicon diffusion depends upon concentration and the diffusion of silicon at a high concentration on the order of solid solubility is effected at a higher rate than that at a lower concentration equal to the impurity concentration implanted into the channel area. The diffusion of silicon from the silicon film in the vicinity of the ohmic contact is higher than the diffusion of silicon implanted in the channel area.

In FIG. 2 (E), reference numeral 207 denotes a profile of silicon diffused by the heat treatment.

The passivation film 206 prevents the GaAs ions in the substrate 201 from being diffused externally and, therefore, only silicon contained in the silicon thin film 202 is diffused into the substrate 201. After the activation of the channel area and the diffusion of the impurity ion by the heat treatment (annealing), the passivation film 206 and the silicon thin film 202 are sequentially etched and removed, as shown in FIG. 2 (E).

Next, as shown in FIG. 2 (F), a sensitive film is formed by using an ohmic contact forming mask and the upper surface of the substrate is subjected to a recess etching process to etch the surface by a thickness of several hundred Å from the surface. As a result, damaged portion of the surface of the substrate 201 can be removed and flattened. Then, an ohmic contact 208 is formed on the etched upper surface of the substrate.

Finally, the surface of the substrate 201 on which a gate is formed is recess-etched to remove several hundred Å of the surface in thickness. Accordingly, the roughed areas of in substrate surface can be removed and flattened. Thereafter, a gate 209 having a relatively low resistivity and made of a metal having an excellent schottky effect is formed on the flattened surface of the substrate.

According to the present invention, it may be considered that the gate forming process can be effected at any time after the impurity ion implantation.

Consequently, a metal thin film is deposited over the entire surface of the substrate and an ion implantation is effected to implant a channel forming ions into the metal thin film. Thereinafter, an impurity ion of phosphorus P or arsenic As is ion-implanted in a N+ area, and the ohmic contact junction portion is highly doped by way of a diffusion of silicon from the silicon thin film through a subsequent annealing (heat treatment) and, at the same time, the impurities implanted in the vicinity of the channel are electrically activated.

An interface between the substrate 201 and silicon thin film 202 is likely to be damaged due to the P or As ion implantation, so that silicon is easily diffused from the silicon thin film 202 into the substrate 201 during the heat treatment.

As a result, the arsenic lattice position is selectively displaced on the GaAs substrate 201, forming cavities in the Ga portion. Accordingly, silicon diffused from the silicon thin film 202 is substituted for the cavities in the Ga portion, thereby obtaining the extremely improved electrical activation.

At this time, a concentration of the doped impurity is set up to the maximum solid solubility at the heat treatment temperature because of thermodynamics balance of the interface. As a result, a minimized resistivity of the electrode can be obtained.

The roughened areas on the surface resulting from the ion-implantation are flattened by a recess etching process to minimize the contact resistance. Also, the surface state of the gate portion is reduced by a recess etching. The use of a metal having a relatively low resistivity as a gate material overcomes the damage of the substrate caused by ions during the sputtering process, known as the so-called, thermostable metal depositing method, or the undesired introduction of impurity, thereby improving the stability of the interface between the gate and substrate, the schottky effect, and the current voltage characteristic of the activation layer.

As noted above, according to the method of the present invention, the contact areas of the source-drain metal electrodes of the GaAs semiconductor are highly doped with impurity ions up to the solid solubility to the contact resistance of the ohmic contact, and the substrate on which the electrodes are formed is recess-etched to a flattened surface state, thereby improving the electrical characteristic of the device.

The gate can be formed with a metal having a relatively low resistivity without employing refractory (or thermostable) metal gate. Accordingly, the transistor can be operated at a high rate.

Meanwhile, when photolithography is carried out using a mask made in consideration of a lateral diffusion of silicon at a predetermined annealing, the distance between the gate and source can be extremely reduced. As a result, the resistance of the source is reduced without employing a self-aligned gate structure, manufacturing a highly integrated circuit element effectively.

Although the present invention has been described with respect to the specified embodiment, it will be understood that many changes and modifications may be made therein without departing from the scope and spirit of the invention.

What is claimed is:

1. A method for manufacturing a GaAs field effect transistor, comprising the steps of:

providing a semi-insulating GaAs semiconductor substrate;

depositing a silicon film on a major surface of said substrate;

forming a first sensitive film pattern on said silicon film to define a channel region;

ion-implanting a first impurity into said substrate to form a channel layer as an active layer;

removing said first sensitive film pattern;

forming a second sensitive film pattern on said silicon film to define spaced ohmic contact areas, and implanting a second impurity through said silicon film into said substrate in only said ohmic contact areas to define spaced high concentration impurity regions beneath said the channel layer and to damage an interface of said silicon film and said substrate only in said ohmic contact areas;

removing said second sensitive film pattern;

forming a passivation film over said substrate after removal of said second sensitive film pattern and performing an activation annealing process so as to diffuse silicon from said silicon film into said channel layer and said high concentration impurity regions, wherein the damage to the interface of the silicon film and the substrate in the ohmic contact areas allows a greater diffusion of silicon in said high concentration impurity areas than in a remainder of said channel layer;

sequentially removing said passivation film and said silicon film;

forming a third sensitive film pattern on said substrate to define source/drain ohmic contact regions at a surface of said high concentration impurity regions;

etching an upper surface portion of said impurity regions within said source/drain ohmic contact regions to form recessed portions therein;

forming ohmic contact electrodes on recessed portions in said source-drain ohmic contact regions;

etching an upper surface portion of said channel layer using a gate mask to form a recessed gate contact region; and forming a gate electrode on said recessed gate contact region.

2. The method according to claim 1, wherein said first impurity is selected from the group consisting of silicon, selenium and sulfur, and said second impurity is selected from the group consisting of phosphorus and arsenic.

3. The method according to claim 1, wherein said passivation film is selected from the group consisting of a silicon oxide film, a silicon nitride film, a silicon oxynitride film and an aluminum nitride film.

4. The method according to claim 1, said passivation film is formed by a process selected from the group consisting of a CVD process, a sputtering process, a plasma CVD process and an electron beam deposition process.

5. The method according to claim 1, wherein said gate electrode is made of a low resistivity metal.

6. The method according to claim 1, wherein said metal is non-refractory.

* * * * *